(12) United States Patent
Onen et al.

(10) Patent No.: US 11,024,790 B2
(45) Date of Patent: Jun. 1, 2021

(54) SINGLE-PHOTON SINGLE-FLUX COUPLED DETECTORS

(71) Applicant: Massachusetts Institute of Technology, Cambridge, MA (US)

(72) Inventors: Oguzhan Murat Onen, Boston, MA (US); Marco Turchetti, Cambridge, MA (US); Karl K. Berggren, Arlington, MA (US); Brenden Butters, Cambridge, MA (US); Mina Bionta, Somerville, MA (US); Phillip Donald Keathley, Natick, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 17/000,959

(22) Filed: Aug. 24, 2020

(65) Prior Publication Data

US 2021/0135084 A1    May 6, 2021

Related U.S. Application Data

(60) Provisional application No. 62/924,506, filed on Oct. 22, 2019.

(51) Int. Cl.
    *H01L 39/10*    (2006.01)
    *H01L 39/18*    (2006.01)
    (Continued)

(52) U.S. Cl.
    CPC ............... *H01L 39/10* (2013.01); *G01J 1/42* (2013.01); *H01L 31/101* (2013.01); *H01L 39/18* (2013.01)

(58) Field of Classification Search
    CPC ........ H01L 39/10; H01L 39/18; H01L 31/101; G01J 1/42
    See application file for complete search history.

(56) References Cited

U.S. PATENT DOCUMENTS

2005/0051726 A1    3/2005    Sobolewski et al.
2014/0299751 A1   10/2014    Tang et al.
(Continued)

FOREIGN PATENT DOCUMENTS

WO    2019152909 A1    8/2019

OTHER PUBLICATIONS

International Search Report and Written Opinion in International Patent Application No. PCT/US2020/047613 dated Nov. 4, 2020, 7 pages.

(Continued)

*Primary Examiner* — Hoang-Quan Ho
(74) *Attorney, Agent, or Firm* — Smith Baluch LLP

(57) ABSTRACT

A device that is a combination of a superconducting nanowire single-photon detector and a superconducting multi-level memory. These devices can be used to count a number of photons impinging on the device through single-photon to single-flux conversion. Electrical characterization of the device demonstrates single-flux quantum (SFQ) separated states. Optical measurements using attenuated laser pulses with different mean photon number, pulse energies and repetition rates are shown to differentiate single-photon detection from other possible phenomena, such as multiphoton detection and thermal activation. Array devices and methods are also discussed.

20 Claims, 12 Drawing Sheets

(51) Int. Cl.
  *H01L 31/101* (2006.01)
  *G01J 1/42* (2006.01)

(56) References Cited

U.S. PATENT DOCUMENTS

| | | | |
|---|---|---|---|
| 2016/0028402 A1 | 1/2016 | McCaughan et al. | |
| 2018/0337648 A1 | 11/2018 | Najafi et al. | |
| 2019/0035904 A1 | 1/2019 | Najafi | |
| 2019/0221605 A1 | 7/2019 | Harrabi | |
| 2020/0027502 A1* | 1/2020 | Berggren | G11C 11/44 |

OTHER PUBLICATIONS

Clem et al., "Geometry-dependent critical currents in superconducting nanocircuits." Physical Review B 84.17 (2011): 174510. 27 pages.

Dane et al., "Bias sputtered NbN and superconducting nanowire devices." Applied Physics Letters 111.12 (2017): 122601. 6 pages.

Ekin, Experimental techniques for low-temperature measurements: cryostat design, material properties and superconductor critical-current testing. Oxford university press, 2006. 14 pages.

Fulton et al., "The flux shuttle—A Josephson junction shift register employing single flux quanta." Proceedings of the IEEE 61.1 (1973): 28-35.

Hadfield, "Single-photon detectors for optical quantum information applications." Nature photonics 3.12 (2009): 696. 10 pages.

Herr et al., "Ultra-low-power superconductor logic." Journal of applied physics 109.10 (2011): 103903. 9 pages.

Janesick, Scientific charge-coupled devices. vol. 83. SPIE press, 2001. 9 pages.

Marsili et al., "Detecting single infrared photons with 93% system efficiency." Nature Photonics 73 (2013): 210. 5 pages.

McCaughan et al., "Using geometry to sense current." Nano letters 16.12 (2016): 7626-7631.

Natarajan et al.,"Superconducting nanowire single-photon detectors: physics and applications." Superconductor science and technology 25.6 (2012): 063001. 17 pages.

Onen et al., "Design and characterization of superconducting nanowire-based processors for acceleration of deep neural network training." Nanotechnology 31.2 (2019): 025204. 10 pages.

Onen et al., "Single-Photon Single-Flux Coupled Detectors," arXiv:1910. 11435, Oct. 24, 2019, 12 pages.

Onen et al., "Single-Photon Single-Flux Coupled Detectors," Nano Lett. 2020, 20, 1, 664-668, Dec. 18, 2019, https://doi.org/10.1021/acs.nanolett.9b04440.

Toomey et al., "Bridging the Gap Between Nanowires and Josephson Junctions: A Superconducting Device Based on Controlled Fluxon Transfer." Physical Review Applied 11.3 (2019): 034006. 9 pages.

Zhao et al., "Single-photon imager based on a superconducting nanowire delay line." Nature Photonics 11.4 (2017): 247.

Zhu et al., "A scalable multi-photon coincidence detector based on superconducting nanowires." Nature nanotechnology 13.7 (2018): 596. 7 pages.

\* cited by examiner

SINGLE-PHOTON SINGLE-FLUX COUPLED DETECTORS

CROSS-REFERENCE TO RELATED APPLICATIONS

This application claims priority to U.S. Provisional Application No. 62/924,506 filed Oct. 22, 2019, titled "SINGLE-PHOTON SINGLE-FLUX COUPLED DETECTORS," the entire disclosure of which is incorporated herein by reference.

STATEMENT OF GOVERNMENT SUPPORT

This invention was made with Government support under Grant No. W911NF-14-C-0089 and W911NF-16-2-0192 awarded by the Army Research Office. The Government has certain rights in the invention.

BACKGROUND

Detection of single-photons is useful for applications such as optical communications, astronomical measurements, and quantum-information processing. Superconducting nanowire single-photon detectors (SNSPDs) are prominent tools for these applications because of their >90% detection efficiencies, near GHz count rates, few picosecond timing jitter, broad spectral sensitivity from ultra-violet to infrared wavelengths, and sub-Hz dark count rates.

SNSPDs operate by amplifying photon-absorption events through the growth of a hotspot (i.e., a normal domain in the superconductor), across which a significant (e.g., a few mV) voltage develops. However, the high kinetic inductance of the superconductor leads to slow recovery (i.e., a longer period for hotspot to grow), causing the possibility of latching and increased power dissipation.

SUMMARY

The present technology and approaches are directed to photodetectors, such as SNSPDs, that include a normal metal film underlying the nanowire. By shunting the nanowire with the metal film both electrically and thermally in this manner, a minimal state of single-photon to single-flux conversion can be achieved. Since direct measurement of the dynamics of single-flux events in a shunted superconductor can be challenging due to the low signal-to-noise ratio, a superconducting loop can be employed to detect the fluxon-tunneling event post-facto. This approach stores fluxon state as a persistent current in the loop. As a result, the number of firing events of the nanowire can be integrated and read out later. This single-photon, single-flux coupled detector can be analogous to a charge-coupled detector (CCD), where the photon detection events lead to accumulation of flux instead of charge, which in turn can provide the number of single-photon detection events, that is analogous to intensity.

A method of optical detection includes applying a bias current to an input arm of a photodetector, the photodetector including a superconducting loop having a constriction in series with the input arm, the bias current flowing through the constriction. The method further includes, for each photon in a set of photons sequentially impinging on the constriction, switching the constriction from a superconducting state to a resistive state, thereby diverting a portion of the bias current into a remaining portion of the superconducting loop. The method further includes, for that photon, returning the constriction to the superconducting state while retaining the portion of the bias current in the superconducting loop as a loop current such that the loop current is a cumulative measure of detection of the set of photons. The method further includes, for that photon, reducing the loop current with a shunt electrically and thermally coupled to the superconducting loop. The method further includes reading the loop current and determining, based on the loop current, a number of photons in the set of photons.

A system includes a biasing circuit to supply a biasing current, and a photodetector that includes an input arm, in electrical communication with the biasing circuit, to receive the biasing current, and a superconducting loop in series with the input arm that includes a constriction. The constriction is configured to sequentially attain a set of superconducting states in response to a corresponding set of photons sequentially impinging on the constriction. (a) In each superconducting state, the bias current flows through the constriction. (b) In response to absorption of a corresponding photon of the set of photons, the constriction attains a resistive state, wherein the bias current is diverted to a remaining portion of the superconducting loop. (c) The constriction then attains a subsequent superconducting state, wherein the constriction returns to its superconducting form, and wherein a portion of the bias current is retained in the superconducting loop as a loop current such that the loop current is a cumulative measure of detection of the set of photons. The photodetector also includes a shunt electrically and thermally coupled to the superconducting loop to reduce the portion of the bias current that is retained at (b), such that the number of photons detectable by the superconduct loop is increased relative to the absence of the shunt. The system further includes a readout arm coupled to the remaining portion of the superconducting loop, and a detection circuit coupled to the readout arm, to detect the loop current. The system further includes a processor operably coupled to the detection circuit, to determine, based on the detected loop current, a number of photons of the set of photons.

A photodetector includes an input arm to supply a bias current and a superconducting loop in series with the input arm and including a constriction. The constriction is switchable among (a) a first superconducting state in which the bias current flows through the constriction to (b) in response to absorption of a first photon, a resistive state, wherein the bias current is diverted to a remaining portion of the superconducting loop. The constriction is further switchable to (c) a second superconducting state, wherein the constriction returns to its superconducting form, wherein a portion of the bias current is retained in the superconducting loop as a loop current. The portion of the bias current is a measure of detection of the first photon, and (a)-(c) are repeatable for each photon of a set of photons including the first photon sequentially impinging on the constriction, such that the loop current is a cumulative measure of detection of the set of photons. The photodetector further includes a shunt electrically and thermally coupled to the superconducting loop to reduce the portion of the bias current that is retained at (b), such that the number of photons detectable by the superconducting loop is increased relative to the absence of the shunt. The photodetector further includes an output arm in series with the superconducting loop to receive the bias current or a remainder portion thereof.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Single-Photon, Single-Flux (Fluxon) Device

Figure 1A:
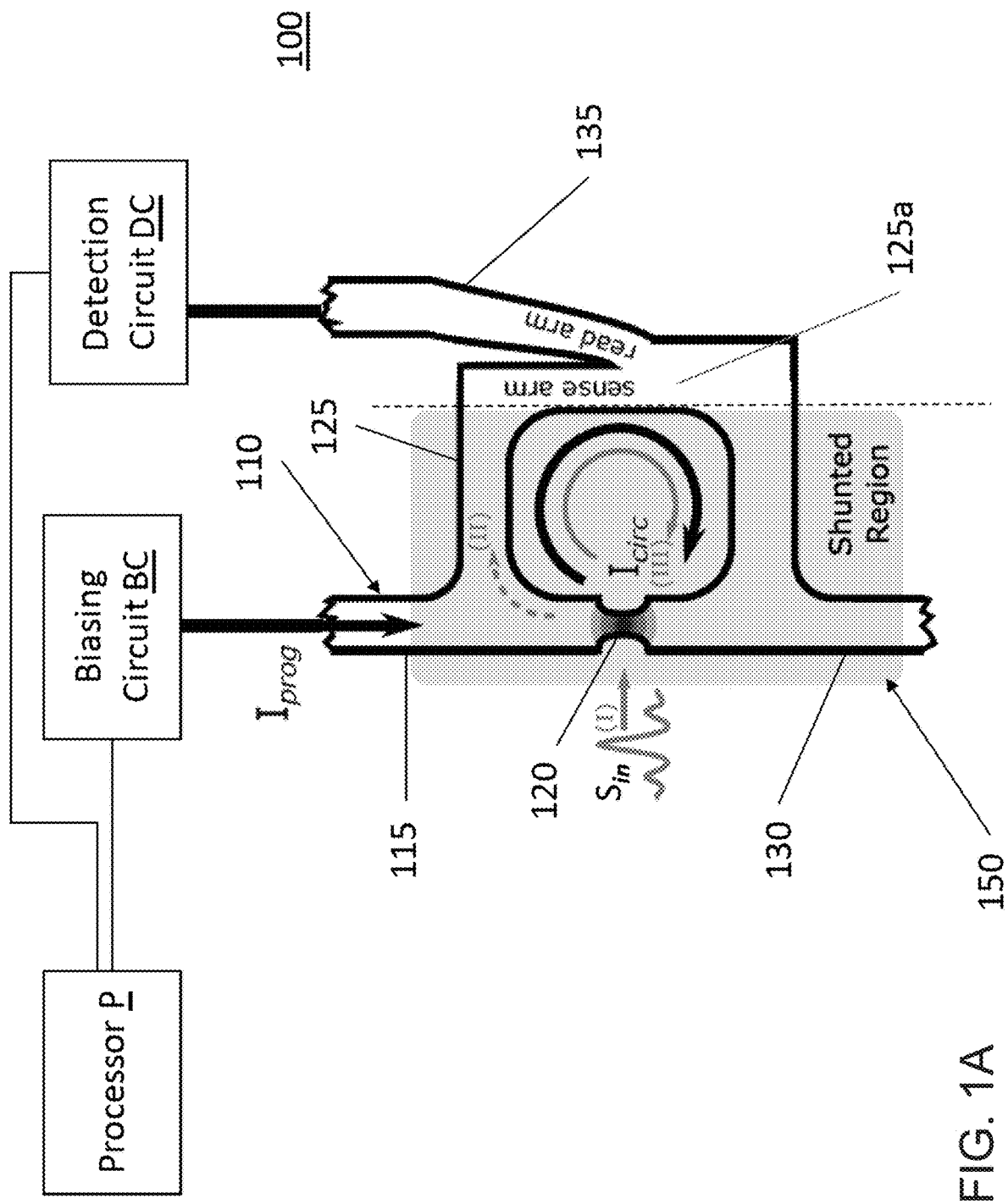
FIG. 1A illustrates a device for single-photon, single-flux detection.
Figure 2A:
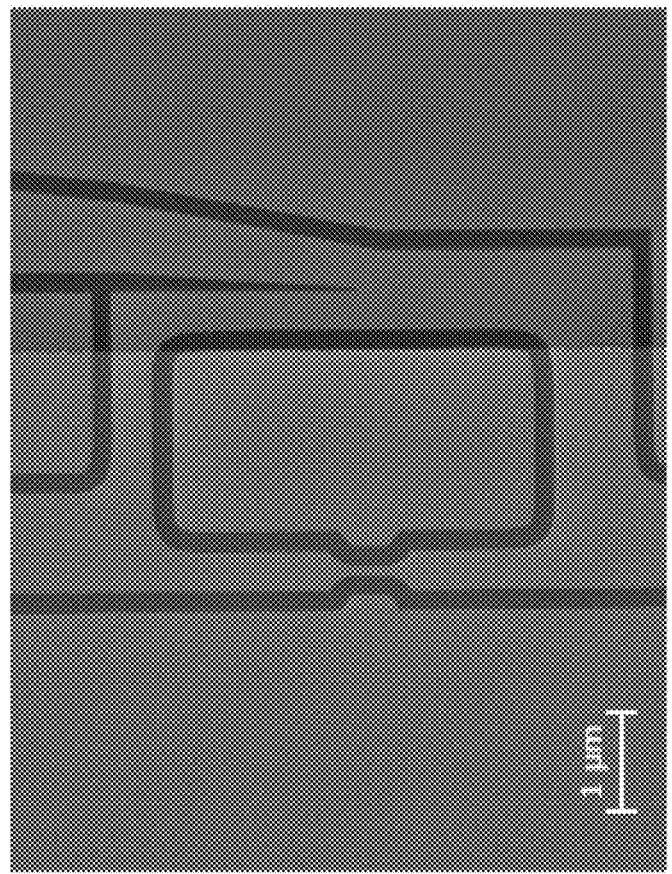
FIG. 2A is a scanning electron micrograph of a fabricated device similar to the device illustrated in FIG. 1A.

FIG. 1A illustrates a device 100 for photodetection that includes a superconducting loop. The device 100 includes a superconducting element 110 and a shunt 150 that can be formed on a substrate such as, for example, a silicon substrate, a $Si_3N_4$-on-Si substrate, and/or the like. The element 110 includes an input arm 115, a superconducting loop 125, and an output arm 130. Example dimensions can include, as best illustrated in FIG. 2A, about 400 nm width for the input arm 115, the output arm 130, and the relatively narrower portions of the loop 125; about 800 nm width for the relatively wider portions of the output loop 125; and about 25 nm thickness. The loop 125 can be about 3 μm×5 μm. The cross-section of these components can be any suitable shape such as circular, elliptical, square, rectangular, and/or the like, and in some cases is rectangular. In some cases, the superconducting loop 125 can constitute a nanowire, such as the meandering nanowire of a superconducting nanowire single photon detector (SNSPD).

A portion of the loop 125 includes a constriction 120 that has a smaller cross-sectional area than other portions of the element 110 (e.g., smaller than that of the input arm 115, the output arm 130, other portions of the loop 125, and/or the like). For example, the width of the constriction can be about 100 nm, and it can have a thickness of about 25 nm. A length of the constriction can be selected based on a desired inductance. The constriction 120 can have any suitable geometry such as, for example, a conical taper, a curved taper as illustrated, and/or the like. As explained in greater detail below, the constriction 120 can be considered the programmable element of the device 100, i.e., one that renders the device responsive to incoming photons/light, such as an optical beam/signal/photon $S_{in}$ incident on the constriction 120. The device 100 and/or the constriction 120 can be designed for optimal operation at a given wavelength/wavelength range such as, for example, the visible-to-near infrared range.

The various components of the element 110 can be integrally formed or separately formed and coupled to each other during fabrication, and can be composed of, for example, niobium nitride (NbN), niobium (Nb), niobium monoxide (NbO), aluminum (Al), tantalum (Ta), technetium (Tc), titanium nitride (TiN), niobium titanium nitride (Nb-TiN), yttrium barium copper oxide (YBCO), bismuth strontium calcium copper oxide (BSCCO), combinations thereof, and/or the like. The selected material(s) can of the element 110 can be based on, for example, the detectable wavelength, a desired photon count rate, kinetic inductivity, number of states, dark counts, operating temperature, and/or the like.

The element 110 can further include a readout arm 135 (also sometimes referred to as a "read arm") that is coupled to a portion 125a (also sometimes referred to as a "sense arm", as demarcated by the dotted line in FIG. 1A) of the loop 125 for reading out the current in the loop 125 as explained further below. In some cases, the readout arm 135 can be separately formed and coupled to the other components of the element 110. The readout arm 135 can be composed of niobium (Nb), niobium nitride (NbN), niobium monoxide (NbO), aluminum (Al), tantalum (Ta), technetium (Tc), titanium nitride (TiN), niobium titanium nitride, combinations thereof, and/or the like. The readout arm 135 can be or encompass a portion of a y-shaped nanocryotron (also sometimes referred to as a "yTron" or a "yTron terminal"), or generally a switch that operates based on superconducting principles.

The shunt 150 can be positioned in a plane underneath the element 110, and be in electrical and thermal contact with at least a portion of the element 110. As illustrated in FIG. 1A, the shunt 150 can be sized (e.g., 400 μm×500 μm, with a 25 nm thickness) and positioned to substantially overlap with the loop 125, including with the constriction 120, and to not overlap with the readout arm 135. For example, the shunt 150 can substantially overlap with the entirety of the loop 125 other than the region of the readout arm 135. As another example, the shunt 150 can substantially overlap with the entirety of the loop 125 other than the portion 125a and the region of the readout arm 135.

During use, a bias/programming current $I_{prog}$ (e.g., provided by a bias circuit BC) can be constantly provided to the element 110 via the input arm 115 to bias the element 110, and temperature control can be employed to maintain the element 110 in a superconducting state. In this state, the current $I_{prog}$ takes the shortest path to the output arm 130, which is through the constriction 120. When the device 100, the element 110, and/or the constriction 120 are in the superconducting state, current flowing through the readout arm 135 is substantially low and can be ignored based on the high inductance ratio.

When a photon impinges on the construction 120, it switches the constriction from being superconducting/in a superconducting state into a non-superconducting, resistive state (denoted by the reference character "(I)"). Since the rest of the loop 125, including the portion/sense arm 125a, remains superconducting, the current $I_{prog}$ is redirected or shunted away from the constriction 120, into the longer arm of the loop 125 (denoted by the reference character "(II)"), and then output through the output arm 130. During this time, the absence of current flow through the constriction 120 restores its superconducting state (i.e., the constriction 120 switches back from the resistive state to the superconducting state). When this happens, any current in the loop 125 ($I_{circ}$) gets persistently trapped in the loop and forms an indication and/or measure of the detection photon. Each additional photon impinging on the constriction 120 can result in additional current being persistently trapped in the loop 125, such that a measure of the current in the loop can be a measure of the number of photon detection events.

In this manner, the device 100 (also sometimes referred to as a "cell" or a "unit cell") can operate as a multi-level memory for photon detection events, where the state of the cell is stored and/or indicated by the persistent current that circulates in the loop 125. Further, the state of the device 100 can be electrically programmed by applying a current signal that exceeds a switching current ($I_{SW}$) of the shunted constriction 120, causing it to switch into the resistive state. The shunting of the constriction 120, by use of the shunt 150, limits the amount of current shuttling into the loop 125 to a single-flux quantum (SFQ) or a fluxon by dampening the process electrically and thermally. Since the same amount of current in the loop 125 can now indicate a greater number of photon events, the photon-counting ability of the device 100 is improved by virtue of inclusion of the shunt 150.

The state of the device 100 can be read by the readout arm 135, using a geometric effect called current crowding. Briefly, if the current density in the readout arm 135 becomes significantly lower than the current density entering the Y-shaped fork (formed by the arm 135, portion 125a) from the loop 125, then current crowding at the forking point can cause the formation of a hot spot and normal resistance in the readout arm 135. Since the measurement of the switching current $I_{SW}$ at the readout arm 135 does not break the superconducting state of circulating current $I_{circ}$ flowing in the loop 125, the circulating current $I_{circ}$, which relates to the number of entrapped fluxons in the loop 125, can be repeatedly measured without changing the state of the loop. So current crowding manifests as a modulation on the switching current of the yTron's readout arm 135 by the circulating current flowing in the loop 125. Therefore, the current at which the readout arm 135 switches can be used to measure the state of the device 100 noninvasively. As the device 100 is non-volatile, the state readout can be performed multiple times, and at low frequencies.

These switching events can be used to switch the state of the device 100 via optical illumination, as the photon(s) $S_{in}$ can create hotspots on the otherwise-superconducting constriction 120 that is biased (with the biasing/programming current $I_{prog}$) close to the switching current $I_{SW}$. For example, the constriction 120 can have at most $\frac{1}{4}^{th}$ the cross sectional area of the loop 125 and/or the readout arm 135. So when the constriction 120 is critically biased, currents in other parts of the wire are well below their switching current, ensuring the photon-triggered counting events being predominantly from the constriction. The device 100 can encompass, or be coupleable to, some optical focusing components such as a lens to limit and/or otherwise focus the photon(s) $S_{in}$ onto the constriction 120. The other components of the device 100 (i.e., other than the constriction 120) can be sized to be insensitive to any stray photons that may be incident on them.

Each photon detection event can then shuttle additional current/flux inside the loop 125, changing the state of the cell/device 100 memory incrementally. The state difference between the two successive readouts, which is the difference between the circulating current values of the two readouts ($\Delta I_{circ}$), yields the number of photons registered by the device 100 in the time interval between the readouts. Each photon detection increases the circulating current in the loop 125, leading to a decrease in the effective bias over the shunted nanowire (FIG. 1H).

Figure 1B:
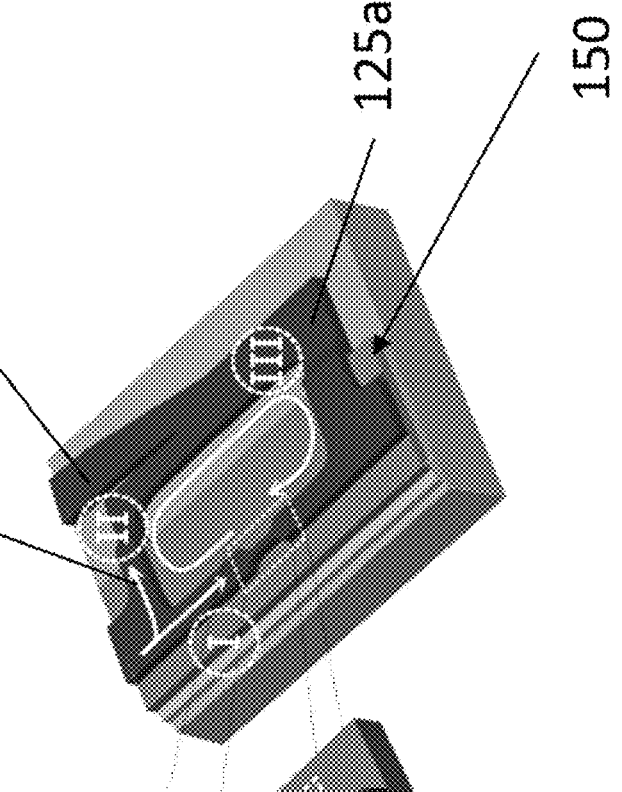
FIG. 1B illustrates a circuit schematic of the device of FIG. 1A.
Figure 1C:
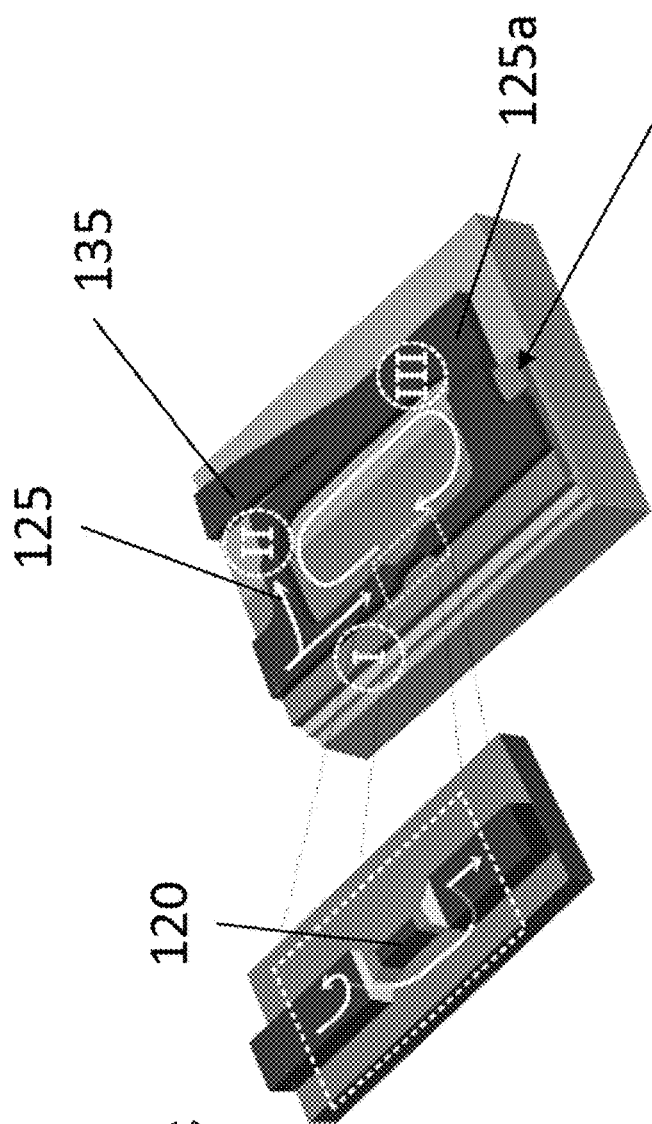
FIG. 1C illustrates redistribution of current due to resistance in the constriction of the device of FIG. 1A (left side), and how return of the constriction to its superconducting state results in the formation of a loop current.
Figure 1D:
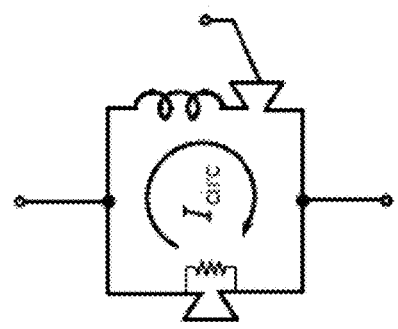
FIG. 1D is a plot of an I-V curve of a shunted nanowire. The inset illustrates a circuit schematic for the shunted nanowire.
Figure 1E:
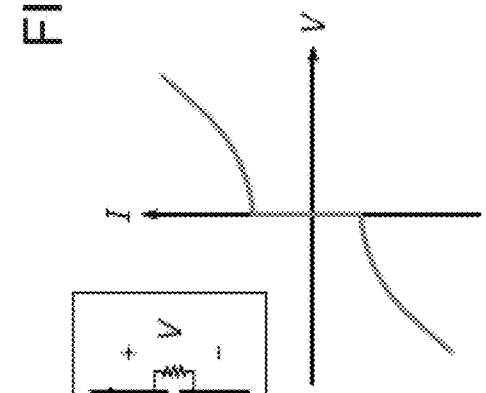
FIG. 1E is a plot illustrating modulation of the switching current in the device of FIG. 1A. The inset illustrates a corresponding circuit schematic.
Figure 1F:
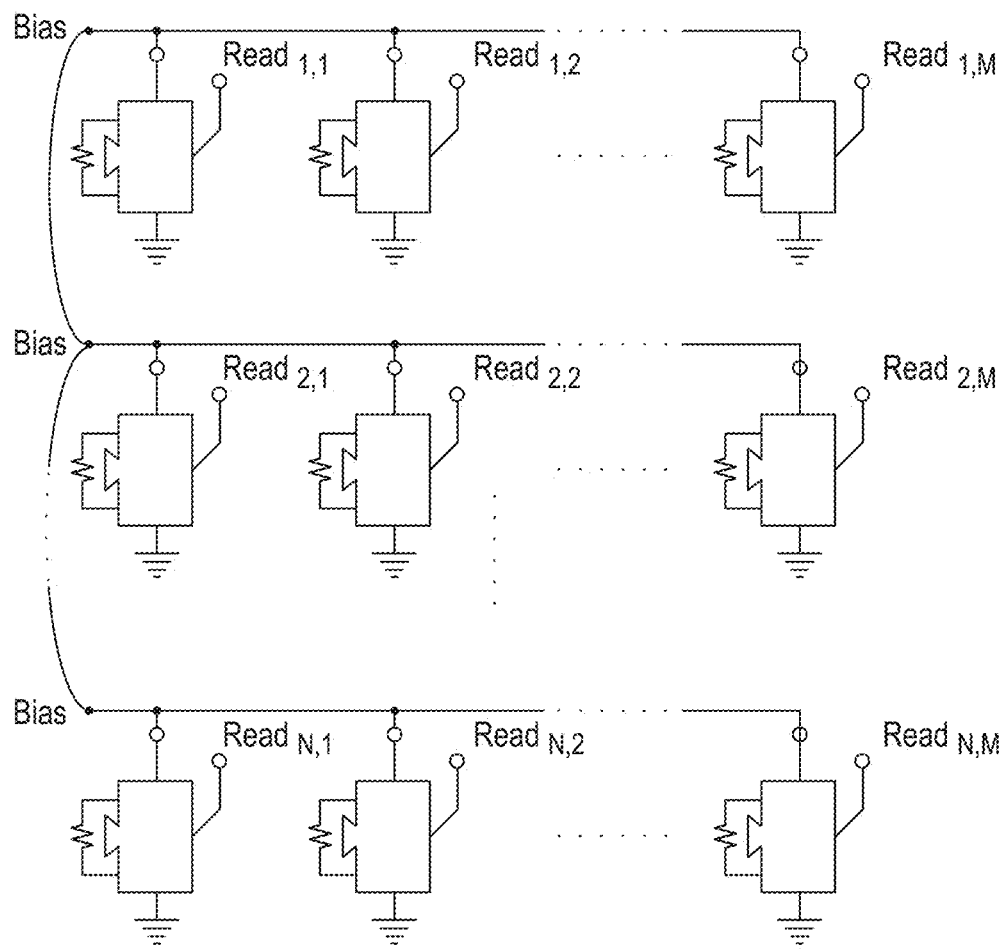
FIG. 1F illustrates an arrayed imaging device with readout at each pixel.
Figure 1G:
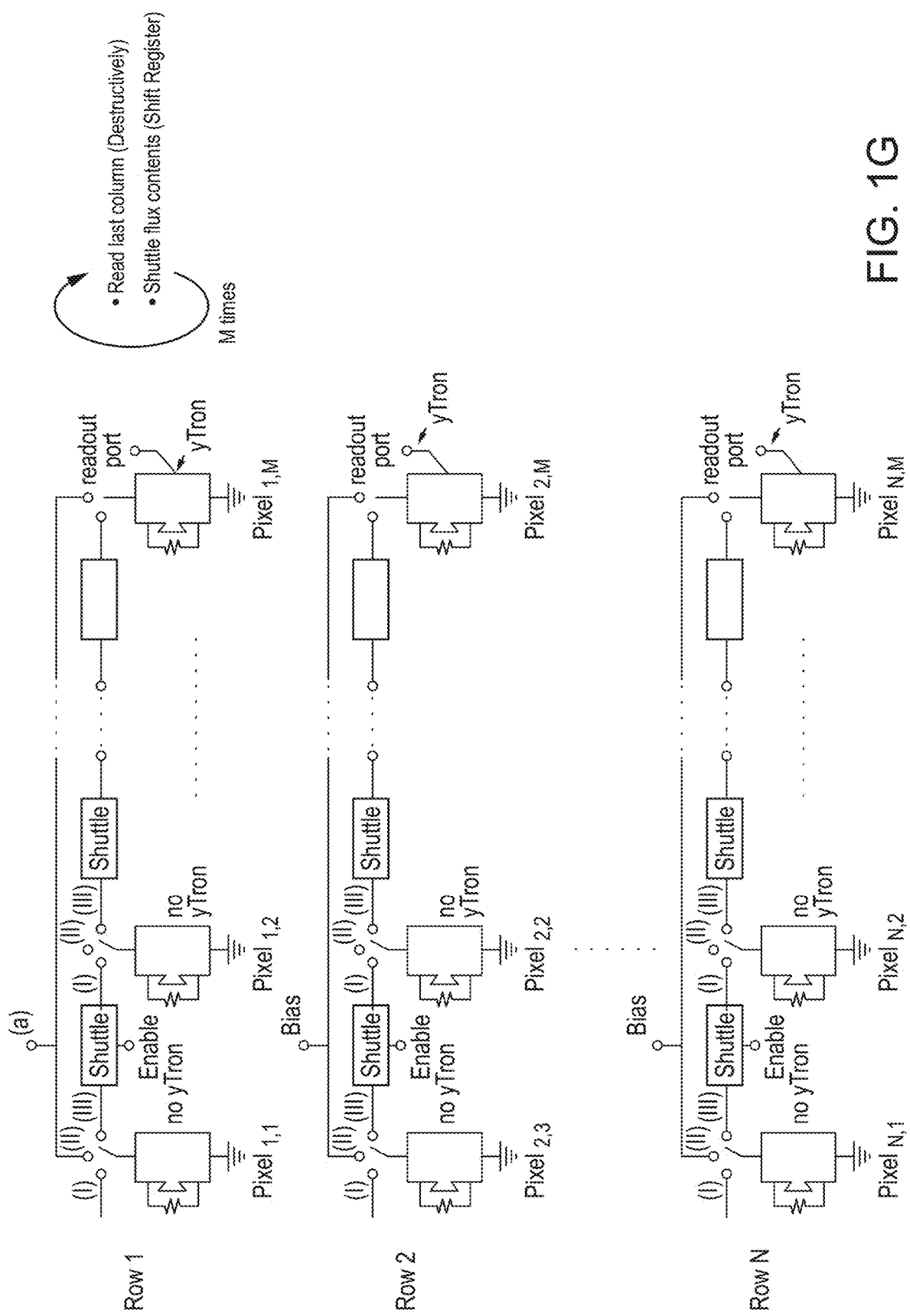
FIG. 1G illustrates an arrayed imaging device with readout at the last column.
Figure 1H:
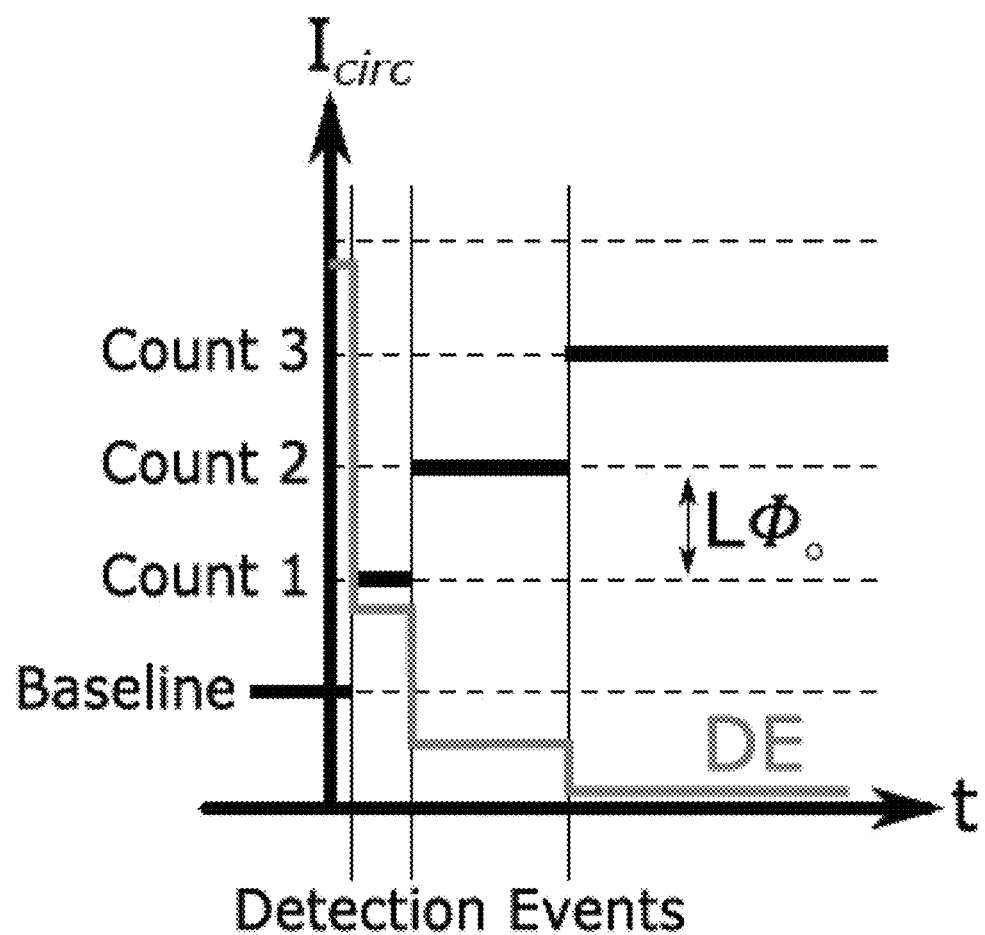
FIG. 1H is a plot of circulating current and detection efficiency vs. time for the device of FIG. 1A.

FIG. 1H illustrates a notional graph of circulating current and the resultant detection efficiency versus time. The circulating current inside the unit cell is used to determine number of single-photon detection events. Increasing $I_{circ}$ reduces the effective bias ($I_{prog}-I_{circ}$) and therefore the detection efficiency. This reduced bias causes a super-linear decrease in detection efficiency, similar to that of CCDs with charge accumulation.

As illustrated in FIG. 1A, a detection circuit DC can be coupled to the readout arm 135 to detect the readout current $I_{circ}$. A processor P can be communicatively coupled to the biasing circuit BC to control generation, timing, etc. of the programming current $I_{prog}$ and to the detection circuit DC to control readout, as well as to conduct any post-readout analysis disclosed herein such as, for example, the number of photons registered by the device 100, the current state of the device 100, and/or the like. The processor P can be, for example, a suitably programmed processor, a Field Programmable Gate Array (FPGA), an Application Specific Integrated Circuit (ASIC), a Digital Signal Processor (DSP), and/or the like. The detection circuit DC can encompass a current source and a voltage comparator, and its operation is described in more detail in Example 1 and with respect to FIG. 8 below.

After readout, the device 100 can be electrically reset to a different state using the biasing circuit BC. For example, first, a high enough reset current pulse with negative polarity (e.g. $I_{reset}=-1.5I_{sw}$) for some amount of time (e.g., on the order of a few microseconds) can be applied to the construction 120 to switch the constriction independent of the initial state of the device, and to set the circulating current $I_{circ}$ to a certain level/state, including a state (also sometimes referred to as a "reset" state or level), where $I_{circ}$ is a counter-clockwise flowing current satisfying condition $|0_{reset}-I_{circ}| \approx 0.95 I_{sw}$, $|I_{circ}| < I_{sw}$. Then, the constriction 120 can again be biased at $I_{prog}$ using the input/bias arm 115 (e.g., $I_{prog}=1.5I_{sw}$) which can set the circulating current $I_{circ}$ to a corresponding level/state, including a state (also sometimes referred to as a "set" state or level) where $|I_{prog}-I_{circ}| \approx 0.95 I_{sw}$, $|I_{circ}| < I_{sw}$. At set level, as the bias over the constriction 120 is the highest ($\approx 0.95 I_{sw}$), it is the most sensitive to incoming photons. Said another way, resetting the device can result in the device attaining any state different from its current state, included a most-sensitive state corresponding to no photons being detected by the device, resulting in a circulating current that creates a net current flow over the constriction 120 that is approximately $0.95 I_{sw}$.

FIGS. 1B-1E illustrate additional aspects for the device 100. FIG. 1B illustrates a circuit schematic of the device 100 as a superconducting loop, where the shunted constriction 120 is the equivalent of a writing element, and the readout arm 135 is the equivalent of a reading element. FIG. 1C illustrates how the constriction 120 switches into a resistive state as a response to the incident photon. Due to the resistance of the constriction 120, current in the loop 125 redistributes, which allows the constriction 120 to heal back to its superconducting state. Once the constriction 120 is fully superconducting again, the excess current gets trapped inside the loop 125.

As explained above, the device 100 can encompass a shunted nanowire of an SNSPD having a constriction. FIG. 1D illustrates a circuit schematic and an I-V curve of a shunted nanowire that shows non-hysteretic characteristics. FIG. 1E shows a circuit schematic and an example graph for yTron, showing modulation of the switching current $I_{SW}$ of the readout arm 135 (also sometimes referred to as a "bias arm") as a function of current flowing in the sense arm portion 125a/loop 125.

Common applications of SNSPDs based on devices as the device 100 can include optical communications, quantum information processing (QIP), and astronomical measurements, dark matter detection, and/or the like. The device may be particularly useful for large-area single-photon imaging since it exhibits superior dark count performance. Since the device can function as a photon number resolving detector (PNR), they can be used is quantum communication as well.

Arrayed Detection Devices

An arrayed detection device, analogous to a charge-coupled device (CCD), can be fabricated using an array of the devices 100 by simply repeating the devices and having $N^2$ devices, N×M devices, etc. with a corresponding number of readout terminals. FIG. 1G illustrates an example N×M configuration using a circuit representation of the device 100 at each pixel of the array. A readout arm/yTron at each pixel permits readout for that pixel. Fewer than this number of terminals could also be used in a shared fashion, like a multiplexer that allows a selection of the devices in the array to be connected to a readout terminal. Once the array is fully read, it can be erased by electrically reprogramming it, by heating it up to cause all devices to lose superconductivity, and/or the like.

As yet another example, and as best illustrated in FIG. 1H, an arrayed detection device can be fabricated using an array of the devices 100 and using a bucket-brigade readout. Josephson junction based electronics and/or nanowires can be employed to shuttling flux between superconducting loops of the devices 100 in the array. Implementation of such a readout scheme makes the device count in the readout periphery of the arrayed detection device lower and/or much more efficient.

Further, in such arrayed detection devices, and as also illustrated in FIG. 1H, since not all devices need to be read individually, some devices can be constructed without a readout arm/yTron. Instead, a loop can be made between the shunted constriction of each individual device/SNSPD with a proper gating element to shuttle flux between the devices, much like a shift register circuit. For example, at the end of each row of devices, there can be a single flux quantum (SFQ) readout circuit that can read destructively (i.e., to reset the pixel after read), or another circuit that can read non-destructively (i.e., maintains the pixel state). Readout can then be performed by reading the end-of-row pixel, followed by shifting the flux content of all cells by one towards this end.

Example 1

Several devices (e.g., like the device 100 in FIG. 1A) were fabricated as a 25 nm thin-film NbN on a metal shunt of 20 nm Ti capped with 5 nm Pt, which in turn was fabricated on a $Si_3N_4$ on Si substrate. The effective thickness of the superconducting layer is less than 25 nm (e.g., 10 nm) due to the proximity or Holm-Meissner effect. The device 100 was not superconducting at 4.2 K when the NbN thickness was ≤10 nm, so the NbN thickness was increased to 25 nm, a thickness that is unusual for single-photon sensing operations. The sheet resistance and critical temperature (Tc) of the unshunted superconducting NbN film were 94Ω/□ and 10.5 K, respectively. The superconducting layer was patterned such that the constriction portion of the loop resided on the metal layer (in-situ shunting) and the yTron side did not. The constriction is 100 nm wide while both yTron arms were 400 nm wide with a connection angle of 75 mrad. Generally, the connection angle can be selected based on a tradeoff between greater sensitivity at lower angles, compared to lower signal-to-noise (SNR) and better non-destructive readout behavior at higher angles.

FIG. 2A shows the scanning electron microgram of the fabricated structure. The contrast difference in the middle of FIG. 2A indicates the edge of the metal shunting layer.

Figure 2B:
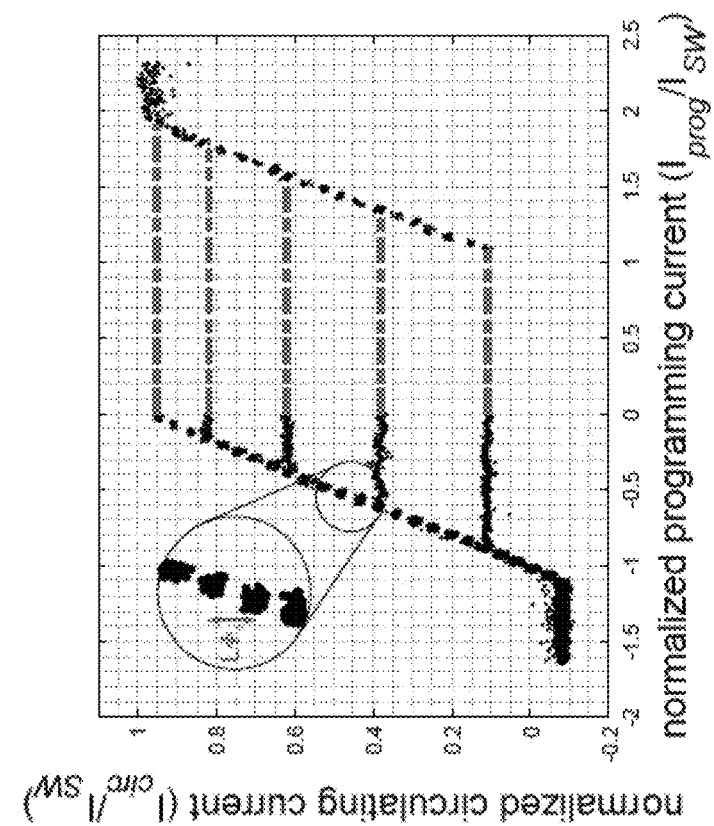
FIG. 2B is a plot of the normalized circulating current vs. the normalized programming current for the device of FIG. 2A, with a portion magnified to illustrate that the separation of states are equivalent to a single flux quantum. The dashed lines indicate expected behavior.

FIG. 2B illustrates electrical characterization of the device. Electrical characterization of the device was carried out in liquid helium (LHe) immersion conditions (4.2 K), by programming the device into different states to quantify the circulating current inside the device at each step as a fraction of the switching current of the shunted nanowire. The device showed 25 states which were separated by a single-flux quantum difference (LC). Multiple traces were used to determine the circulating current, $I_{circ}$ and programming current $I_{prog}$ normalized to the switching current $I_{SW}$ of the device at different states. These results also show that at any given state, the effective bias was equal to 0.95 $I_{SW}$, which is comparable to the SNSPD bias levels for single-photon detection.

Considering that the device includes 32.6 squares and an estimated kinetic inductivity ($L_k$) of 12:4 pH/□, a single-flux in this loop should be equal to 5.1 μA. On the other hand, another stand-alone nanowire on this chip has a switching current ($I_{SW}$) of 62 µA, indicating that the separation of states is 2.7 µA, equivalent to 0:53 $\Phi_o$. This discrepancy is attributed to underestimating the kinetic inductivity increase in the shunted region due to suppression of superconductivity (the calculations assume a single $L_k$ value which is estimated for the unshunted region).

Furthermore, it was observed that the relative alignment of the metal shunt and the NbN heavily influenced the biasing conditions. The inductance ratio of the two arms (i.e., the sense arm and the read arm) can be a strong function of what portion of the yTron branch, a term that characterizes the superconducting loop (e.g., the loop 125) excluding the sense arm (e.g., the portion 125*a*) and the read arm (e.g., the arm 135), is shunted. It can be seen from FIG. 2B that the optimal ratio was obtained when the metal layer was in contact with the yTron branch until, but excluding, the active readout area of the sense and readout arms, as illustrated in the layouts in FIGS. 1A and 2A. Shunting of the readout arm/yTron itself reduced the readout performance. This behavior also suggests large kinetic inductivity difference between the shunted and the unshunted regions and can render desirable the placement of the metal layer as close as possible to (but not in contact with) the yTron.

Optical characterization of the device was carried out using an 80 µW continuous waveform laser centered at 680 nm to illuminate the device at different programming currents. The actual photon flux entering the active area (i.e., the constriction) was small ($\leq 8:2 \times 10^4$) due to flood illumination of the chip with a large divergence angle from about 2 cm distance, while the area ratio of the active area to the beam spot size was about $3 \times 10^{-10}$. Considering that the effective bias ($I_{prog} - I_{circ}$) is the same (0.95 $I_{SW}$) at any given state (FIG. 2B), the optical response ($\Delta I_{circ}$) should also be independent of the initial state.

Figure 3B:
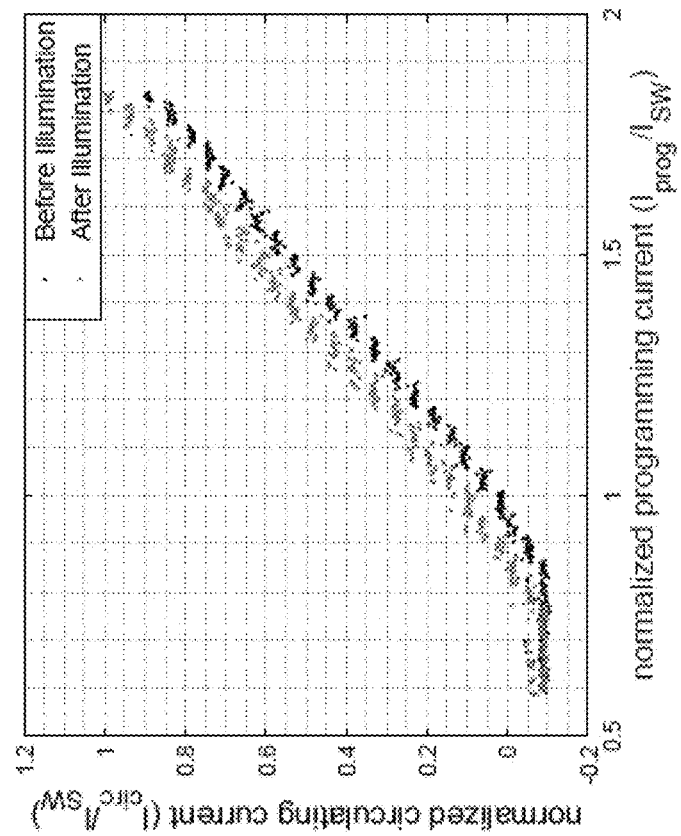
FIG. 3B is a plot of the normalized circulating current vs. an optical pulse count for the device of FIG. 2A and demonstrates single-photon counting.
Figure 3A:
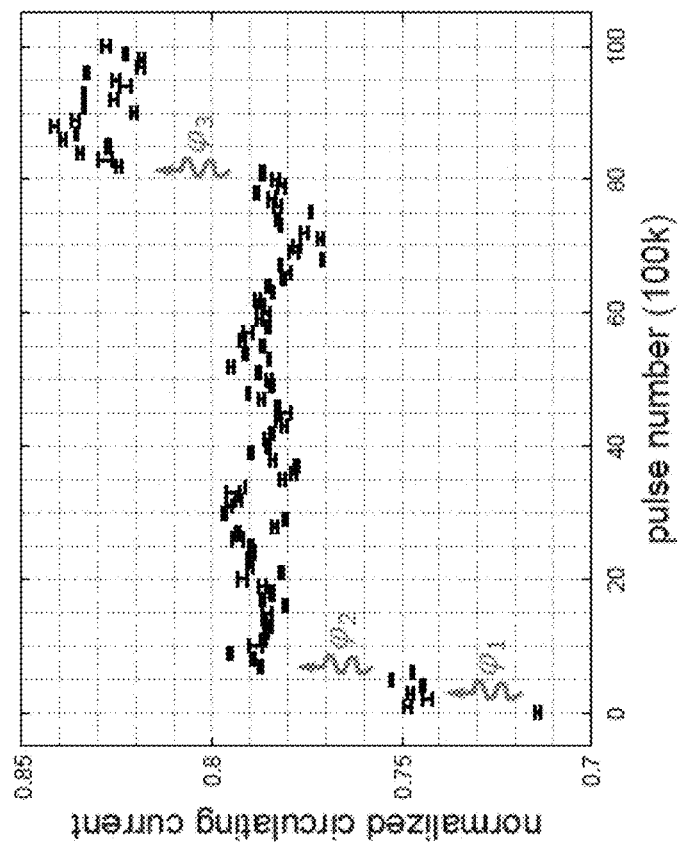
FIG. 3A is a plot of the normalized circulating current vs. the normalized programming current for the device of FIG. 2A for different programming conditions.

FIG. 3A shows the change in state of the device before and after the illumination, which, as expected, is not a function of the programming current $I_{prog}$. Specifically, FIG. 3A illustrates optical modulation of the $I_{circ}$ for different initial programming conditions. The device was first set to a state and then illuminated with an 80 µW continuous waveform laser at 680 nm for 5 seconds while keeping the same programming current. The state change of the device (i.e., the normalized circulating current difference between successive reads before and after the illumination) was indifferent to the initial programming as expected, which can be seen as shifted state curves for before and after illumination readouts.

To further investigate the optical response of the device, the device was illuminated using an ultrafast pulsed laser centered at 1030 nm, with a pulse duration of about 400 fs, a variable pulse repetition rate between 250 kHz and 4 MHz, and pulse energies between 10-200 pJ. This setup allowed for to control the number of pulses sent, pulse energy, and pulse repetition rate.

To demonstrate the incremental counting behavior, the device was set to a baseline state electrically, and periodically read after every $10^5$ pulses sent from the laser. FIG. 3B shows that the device was able to accumulate up to 3 subsequent counting events at a constant programming current $I_{prog}$. Specifically, FIG. 3B shows the device was initially set to an electrical state, e.g., as described for FIG. 3A and/or using the biasing circuit BC to reset the device, and then illuminated with an ultrafast laser centered at 1030 nm, with a pulse repetition rate of 1 MHz and pulse energy of about 80 pJ. A readout is performed following each pulse train to probe if the state has changed in that cycle. The state of the device changed by a single-flux quantum three times as a response to optical pulses. The beam spot size was about 1 cm$^2$ for both cases.

It can also be observed that for each count, decreasing the effective bias across the nanowire, led to a sharp decrease in the detection efficiency as explained below, which can be observed as an increased duration between successive detection events. In practical operation, following the reading of the device, the state of the cell/device can be reset back electrically using the biasing circuit. After reset, the detection efficiency is restored, and the device can continue counting.

Figure 4:
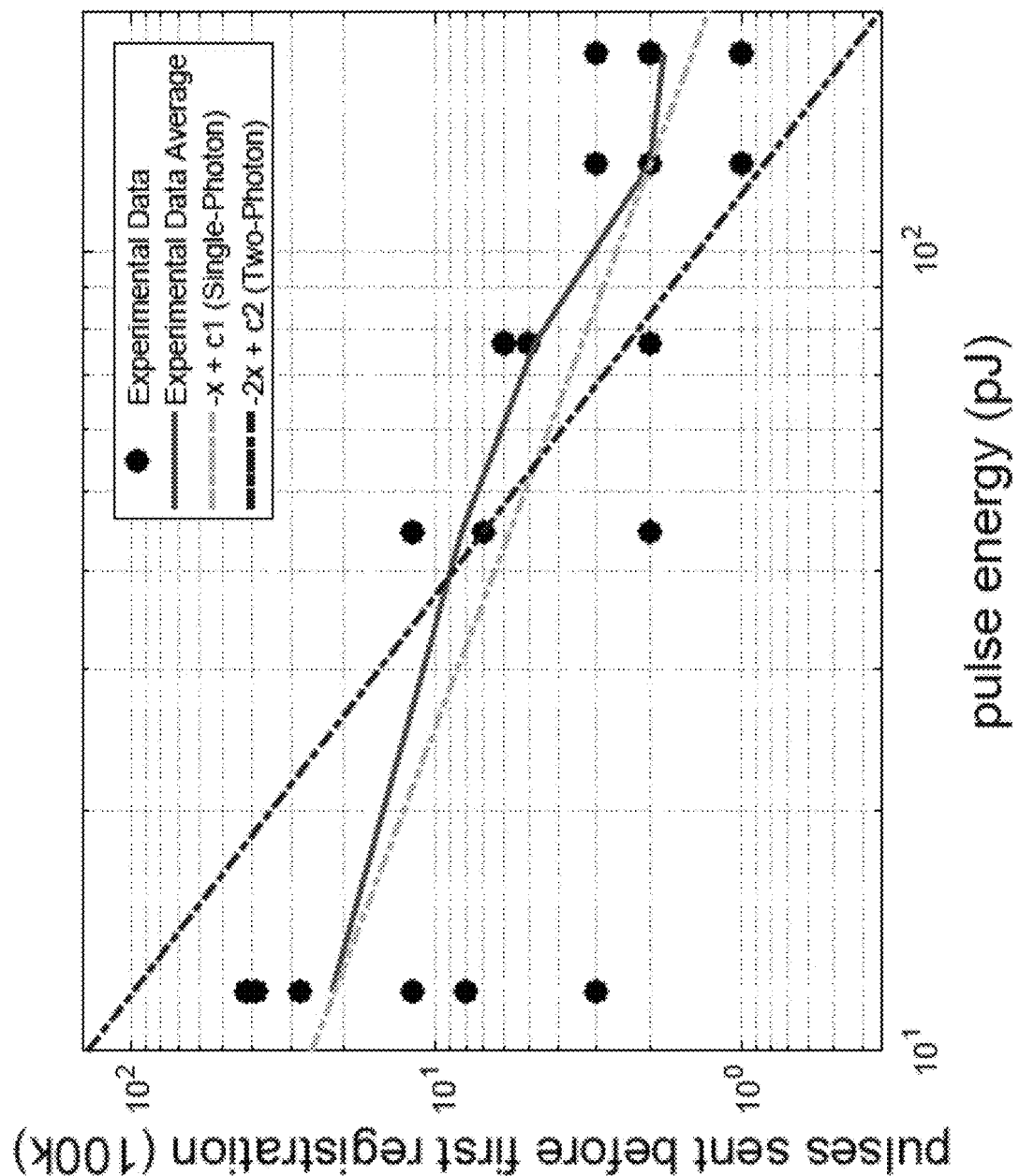
FIG. 4 is a plot of optical pulses applied to the device of FIG. 2A prior to registration vs. pulse energy and demonstrates single-photon detection by the device.

So as to better understand the nature of these counts (single-photon, multi-photon or bolometric), the energy of each pulse was changed, and the average number of pulses sent before the first count were recorded at a constant laser repetition rate. As shown in FIG. 4, despite the high standard deviation of the events, the energy dependence can be explained using single-photon-dynamics. Specifically, FIG. 4 illustrates a log-log plot for number of pulses sent before the first registration for different pulse energies at same wavelength (1030 nm) and pulse repetition rate (1 MHz). Theoretical curvatures of single-photon and two-photon mechanisms are shown as guidelines. Detection phenomena involving more than two photons should generate theoretical curves with even larger slopes than the simulated two-photon curve and therefore are not shown in FIG. 4. The optimal line slope that fits the full data is −0.84, which is very close to the expected −1. The p-values estimated using a paired-sample t-test for the single-photon and two-photon hypotheses are 27.33% and 8.21% respectively. FIG. 4 is analogous to the conventional count rate vs. pulse energy graphs of SNSPDs, with an inverted y-axis, since the number of pulses required for the first triggering event is inversely proportional to the count rate.

Furthermore, the counting probability here is on the order of $10^{-4} \ll 1$, also suggesting that the device/detector is operating in the single-photon regime. Neither the detector geometry (100 nm×300 nm detector area) nor the material stack were optimized for detection efficiency at the experimental wavelengths.

Figure 5:
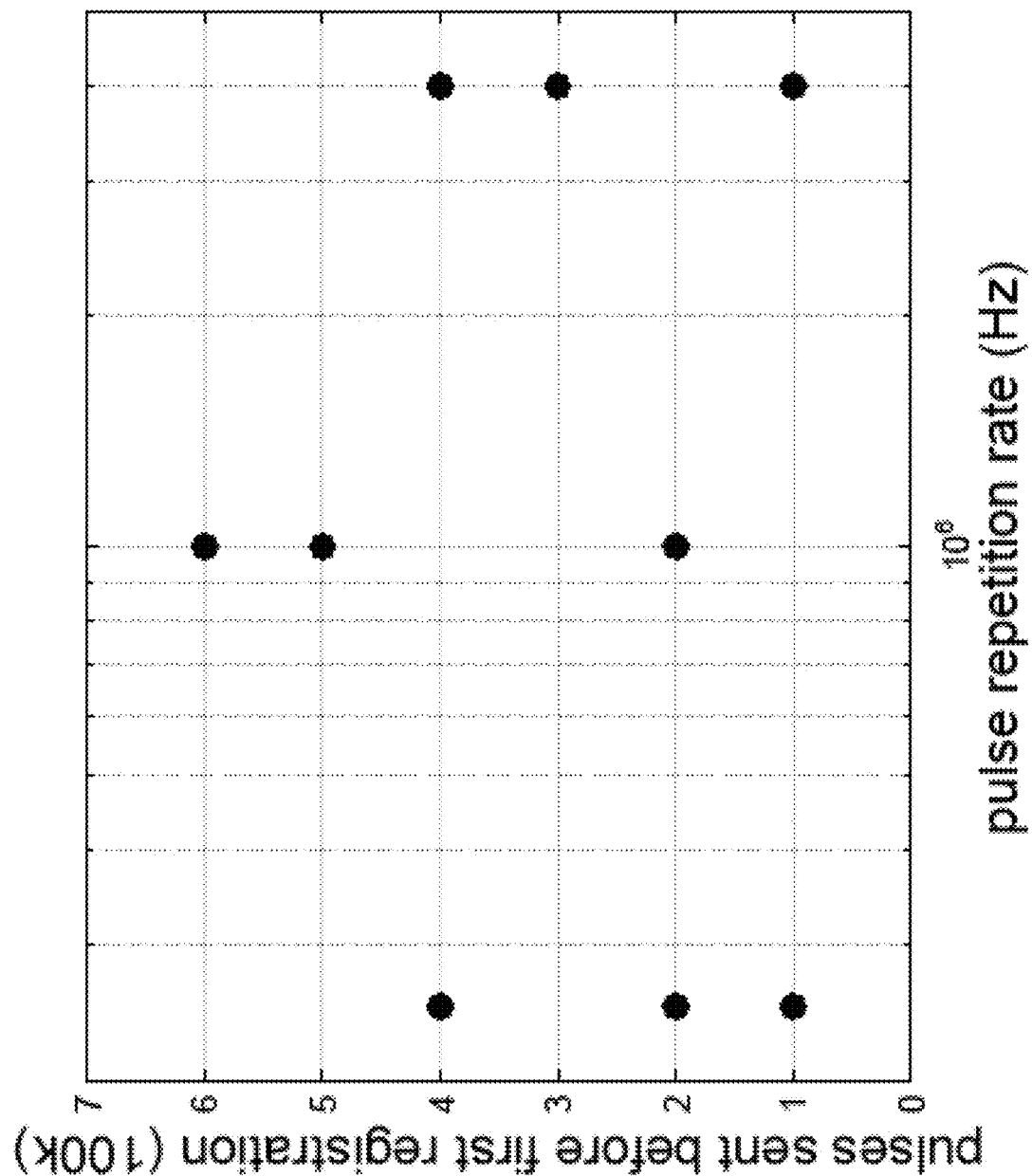
FIG. 5 is a plot of optical pulses applied to the device of FIG. 2A prior to registration vs. pulse repetition rate and demonstrates independence, from repetition rates between 250 kHz and 4 MHz, of the device.

In order to distinguish between single-photon-based or bolometric detection mechanisms, pulses with the same energies but varying repetition rates were applied to the device. Doing so allowed for controllable delivery of the same number of photons with different optical powers, and hence different amounts of heat on the device. As shown in FIG. 5, no correlation was observed between photon counting probability and pulse repetition rates between 250 kHz and 4 MHz. Specifically, FIG. 5 illustrates results of this pulse repetition rate dependence experiment, where a number of pulses sent before the first registration for different pulse repetition rates at same wavelength and pulse energy.

Figure 6:
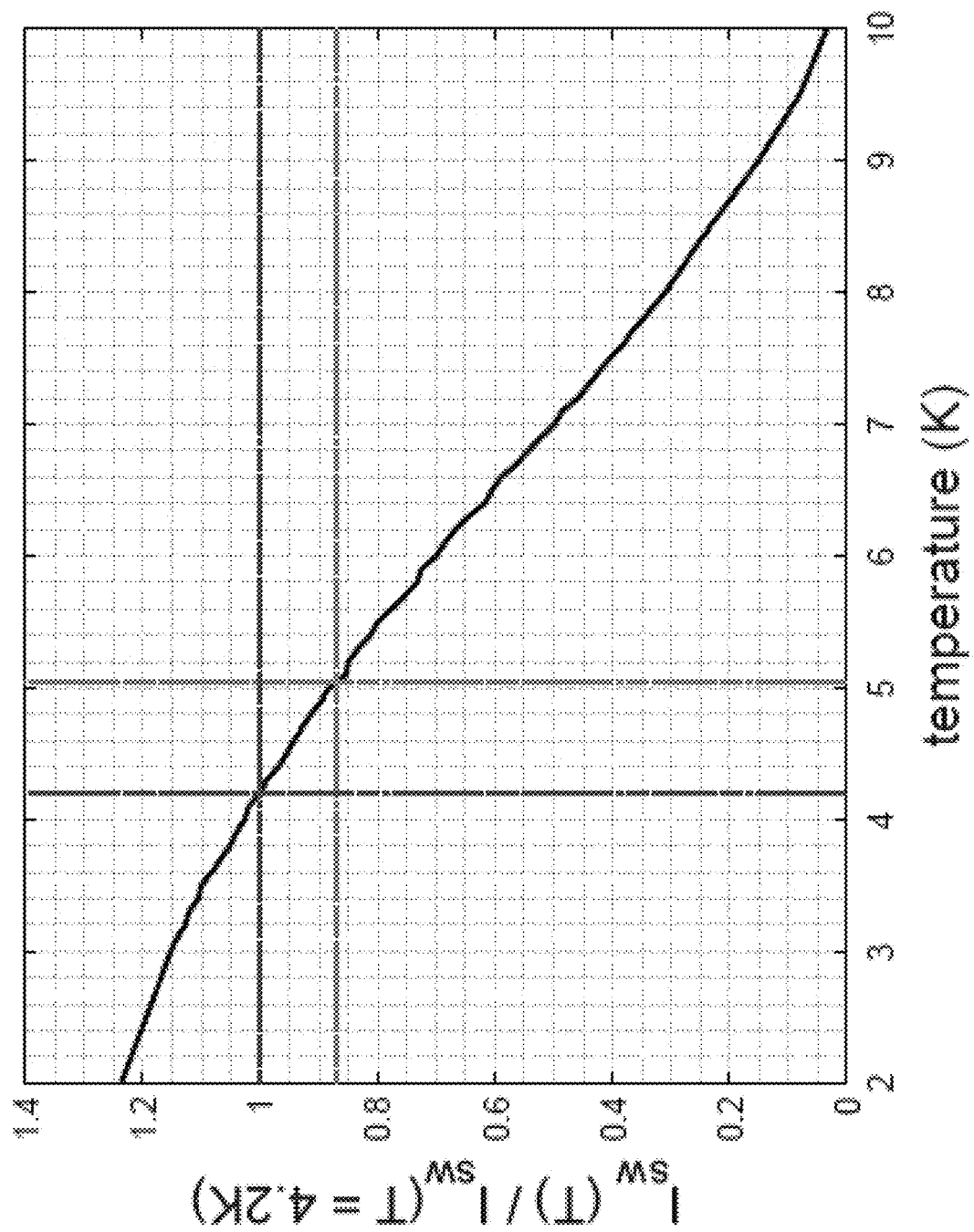
FIG. 6 is a plot of normalized switching current of the device of FIG. 2A at different temperatures.

For a bolometrically operated device, the device operates by switching current suppression through the increased temperature caused by photon absorption. FIG. 6 shows the switching current of a stand-alone, unshunted nanowire fabricated on the same chip with the same geometry, versus temperature, normalized to its switching current at 4.2 K. The data in FIG. 6 is normalized to the switching current at 4.2 K. The dark dashed line indicates the liquid helium temperature (4.2 K) and light dashed line indicates 0:87 $I_{SW}$ (three state suppression) which occurs at 5.05 K. The laser used in the photon-counting demonstrations has a power less than 300 µW, which is expected to heat the substrate no more than 19 mK in immersion conditions.

The results show that a suppression in $I_{SW}$ that is equal to the $\Delta I_{circ}$ between 3-count separated-states (operation limit shown in FIG. 3B, $\Delta I_{circ} \approx 0.13 I_{SW}$), would be responsive to a chip temperature increase to about 5.05K. Under LHe immersion and low radiation flux conditions, the <300 $\mu Wcm^{-2}$ input irradiation can increase the substrate temperature up by 19 mK, which is much less than the change for bolometric operation. These results strongly suggest that the detection process is not thermally mediated, i.e., the switching events do not occur due to the heating of the entire chip.

Figure 7:
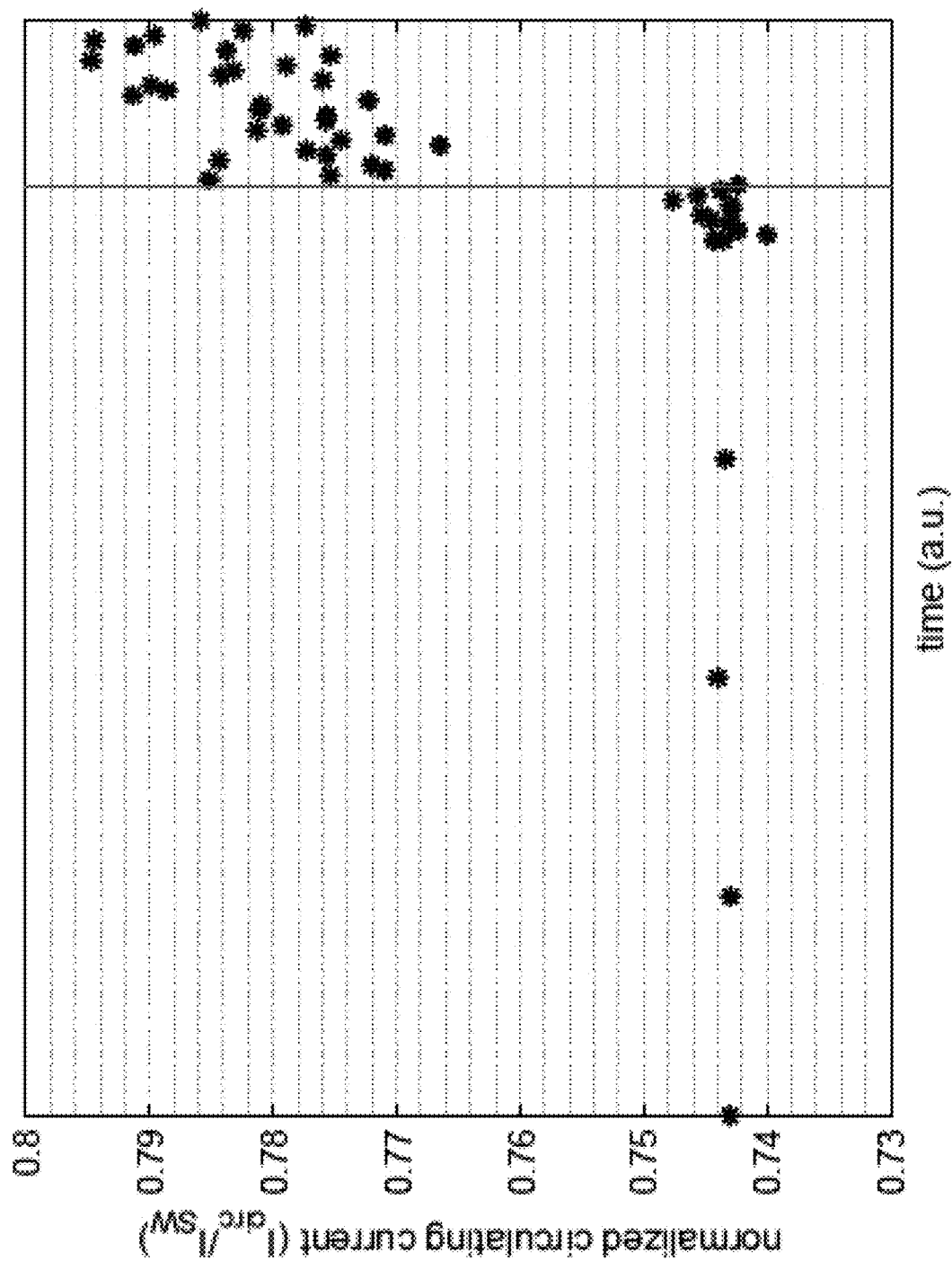
FIG. 7 is a plot of normalized circulating current of the device of FIG. 2A over time and after biasing the device.

Finally, the dark count performance was characterized by biasing the device for 10 hours without any illumination, while periodically performing readout. No change was observed in the device state for this period (see FIG. 7). FIG. 7 illustrates results of a dark count experiment, where the device was biased at the most sensitive reset level/state, corresponding to about $0.7 I_{circ}/I_{SW}$) and state was monitored for 10 h with 2.5 h intervals. No state change was observed during this 10-hour period. Following this 10-hour period, the device was illuminated to check operation, indicated by the vertical line at right.

DISCUSSION

Presented here are hybrid devices that combine the advantages of SNSPDs and CCDs through single-photon to single-fluxon conversion. These devices can count up to three photons incrementally without any feedback circuitry. The states of these devices are nonvolatile and do not suffer from dark counts. These devices are suitable for constructing large arrays to produce contrastive information under long exposure and low-illumination scenarios at the expense of time-resolution of the photon arrival. The single-photon to single-fluxon conversion observed in these devices are not expected to be coherent, considering the thermal nature of the switching event.

Variations of the devices described here can be employed. For example, the device area can be increased by replacing the short nanowire with a long, meandering nanowire. Additional modifications would then include a balance inductor on the yTron side, to keep the biasing ratio the same. More specifically, since an SNSPD is larger than a nanowire, and has higher inductance, the yTron side's inductance should be increased in order to maintain the dynamics of flux trapping and shuttling between the loop and the yTron.

As another example, a detector with detection efficiency saturating at an earlier biasing current can increase the number of photons the device can count up to. For example, WSi detectors can be employed, which have shown saturated detection efficiencies at bias levels down to $0.375 I_{SW}$. Considering that the kinetic inductivity of WSi is higher than NbN, the quantization of the states can be finer as well, which in turn can also increase the number of states, and such a detector can detect up to 100 detection events with single flux precision.

In conclusion, the devices disclosed here can be used large-scale single-photon detectors with CCD-like characteristics through single-photon single-flux coupling. The devices can exhibit high detection efficiency, a wide range of counting, fast readout and effective arraying.

Fabrication of the Device/Unit Cell

The devices were fabricated on a 100 nm $Si_3N_4$-on-Si substrate. The first metal layer was patterned by a liftoff process, for the fabrication of the shunts. The metal islands were defined using electron-beam lithography for the high precision definition of the shunting region. PMMA was used as the electron beam resist and was developed in 3:1 IPA:MIBK solution at 0° C. Liftoff was performed by soaking in 60° C. NMP for 1 h.

The NbN layer was then sputtered using magnetron sputtering at room temperature. The sheet resistance of the film was measured using a four-point probe. Patterning of the superconducting layer was performed using electron beam lithography. ZEP520A was used as the resist and back-scattered electron detector for the alignment with the former layer. Exposure was done using Elionix FLS-125, at 500 $\mu C/cm^2$ dose with 500 pA beam current for small features (devices) and 40 nA for larger features (leads and contact pads). The resist was developed in o-Xylene at 5° C. for 90 seconds followed by 30-second dip in isopropanol and $N_2$ gun dry. NbN was etched with reactive ion etching using $CF_4$ at 50 W, for a total period of 360 seconds partitioned in three equal steps. Excess resist was stripped in n-methyl-2-pyrrolidone (NMP) at 70° C. for 1 hour. The pads were defined with a direct photolithography step using a bilayer stack of PMGI-SF9 and S1813, exposed by using Heidelberg $\mu$PG 101 direct writer with 7 mW beam at 25% duty cycle and developed in CD-26 followed by NMP liftoff. A Zeiss Orion SEM was used to image the devices at 5 kV acceleration voltage at 4:8 mm working distance using the in-lens detector with 30 $\mu$m aperture size.

Electrical Characterization

A plurality of devices were fabricated using different material stacks and geometries. It was determined that placing the Pd/Ti shunt beneath the NbN layer (i.e., disposed between the NbN layer and the substrate) provided for better shunting performance than if the shunt was above or to the side of the NbN layer. Further, it was observed that Pd was relatively superior to gold (Au) for shunt performance. It was also observed that a relatively thinner NbN layer than that used was not substantially superconducting, while a relatively thicker NbN layer than that used had relatively worse sensitivity.

The devices that could be programmed using electrical signals could also be programmed optically with varying sensitivities and noise levels. The results reported here are based on one representative device out of these trials. In FIG. 2B, the device was first set to an arbitrary state electrically by varying the programming current $I_{prog}$ applied to the biasing arm. Consequently, $I_{prog}$ was incrementally increased and the first programming voltage that modifies the state was recorded. At this point, the total current flowing through the nanowire was $(I_{prog}-I_{circ})=I_{SW}$. Similarly, when the same procedure was conducted by decreasing the programming current, the same equation held for $-I_{SW}$ when the state decremented. So both currents $I_{prog}$ $I_{circ}$, in terms of $I_{SW}$, can be calculated at any given point on this curve. Once the $I_{circ}$ was found in relation to the $I_{SW}$, with the additional information of the switching current measured on an unshunted nanowire, fabricated together on the same chip for reference (62 $\mu$A) the separation between these states was found to be about 2.7 $\mu$A. Due to the imperfections of the yTron, most of the negative states (counterclockwise currents) resolved in the same output, leading to utilization of 25 states out of 46. This property was determined using the sign of the $I_{circ}$ for different states where there should be an equal number of states on both polarities.

Figure 8:
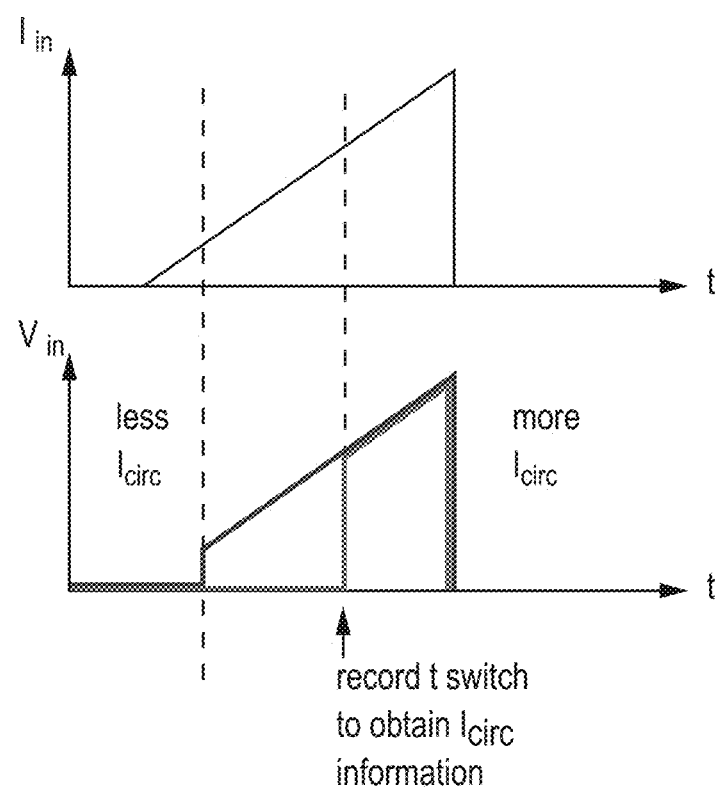
FIG. 8 is a plot of input current (top plot) and detected voltage (bottom plot) applied to a readout arm of the device of FIG. 2A to determine the minimum current to switch the readout arm to the resistive state.

FIG. 8 illustrates how a ramping current input (top plot) is applied to the readout arm/yTron using a current source (e.g., of the detection circuit DC), and the time at which it produces a voltage signal, that is determined using a voltage comparator of the circuit DC. The current input at that point is the readout. Once the initial readout of all states for that device are done as described for FIG. 2B, then one can detect which state the device is in (akin to using a look-up table), without disturbing the state of the device.

Optical Characterization

The results shown in FIG. 3B were obtained with an ultrafast laser with an output centered at a wavelength 1030 nm, with a repetition rate of 1 MHz and pulse energy of about 80 pJ. Each pulse in the laser output included about $4 \times 10^8$ photons. The spot size of this laser was about 1 cm$^2$, for an area ratio (between the spot size and detector) of $3 \times 10^{-10}$. The first detection event was registered after the first readout, which was performed after sending $10^5$ pulses, or about $1.2 \times 10^4$ thousand photons (i.e., a counting probability of $8.3 \times 10^{-5}$). The dark count rate was characterized by biasing the device for 10 hours without any illumination while periodically performing readout. No change was observed in the device state for this period (FIG. 7).

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of optical detection, comprising:
applying a bias current to an input arm of a photodetector, the photodetector including a superconducting loop having a constriction in series with the input arm, the bias current flowing through the constriction;
for each photon in a set of photons sequentially impinging on the constriction:
switching the constriction from a superconducting state to a resistive state, thereby diverting a portion of the bias current into a remaining portion of the superconducting loop;
returning the constriction to the superconducting state while retaining the portion of the bias current in the superconducting loop as a loop current such that the loop current is a cumulative measure of detection of the set of photons; and
reducing the loop current with a shunt electrically and thermally coupled to the superconducting loop;
reading the loop current;
determining, based on the loop current, a number of photons in the set of photons.

2. The method of claim 1, the reading further comprising reading the loop current based on a current crowding effect.

3. The method of claim 1, wherein the set of photons includes at least two photons.

4. The method of claim 1, the returning the constriction to the superconducting state including attaining, by the constriction, a subsequent superconducting state, wherein the constriction is switchable to sequentially attain up to twenty five subsequent superconducting states.

5. The method of claim 1, wherein at least a portion of the superconducting loop includes a nanowire, and wherein the nanowire includes the constriction.

6. The method of claim 1, further comprising, after the reading, resetting the loop current by modifying the bias current to be at least twice a switching current of the constriction.

7. The method of claim 1, further comprising, prior to the applying, characterizing the photodetector by:
setting the constriction to a first superconducting state of the set of superconducting states by applying the bias current at a first predetermined magnitude;
measuring the loop current;
increasing, in a stepwise manner, the magnitude of the bias current while monitoring the loop current; and
identifying, as a transition from the first superconducting state to a second superconducting state of the set of superconducting states, when an increase in the bias current results in an increase in the loop current.

8. A system, comprising:
a biasing circuit to supply a biasing current;
a photodetector, comprising:
an input arm, in electrical communication with the biasing circuit, to receive the biasing current;
a superconducting loop in series with the input arm and including a constriction, wherein the constriction is configured to sequentially attain a set of superconducting states in response to a corresponding set of photons sequentially impinging on the constriction, wherein:
a) in each superconducting state, the bias current flows through the constriction;
b) in response to absorption of a corresponding photon of the set of photons, the constriction attains a resistive state, wherein the bias current is diverted to a remaining portion of the superconducting loop; and
c) the constriction attains a subsequent superconducting state, wherein the constriction returns to its superconducting form, wherein a portion of the bias current is retained in the superconducting loop as a loop current,
such that the loop current is a cumulative measure of detection of the set of photons;
a shunt electrically and thermally coupled to the superconducting loop to reduce the portion of the bias current that is retained at step (b);
a readout arm coupled to the remaining portion of the superconducting loop;
a detection circuit, coupled to the readout arm, to detect the loop current; and
a processor operably coupled to the detection circuit, to determine, based on the detected loop current, a number of photons of the set of photons.

9. The system of claim 8, wherein the shunt is thermally and electrically isolated from the readout arm.

10. The system of claim 8, wherein the readout arm is configured to detect the loop current based on a current crowding effect.

11. The system of claim 8, wherein the set of photons includes two photons or more.

12. The system of claim 8, wherein the set of superconducting states includes up to twenty five superconducting states.

13. The system of claim 8, wherein the photodetector is a superconducting nanowire single-photon detector (SNSPD), and wherein the SNSPD includes the constriction.

14. The system of claim 8, further comprising a photodetector array, wherein the photodetector is a first photodetector of a set of photodetectors of the photodetector array.

15. A photodetector, comprising:
an input arm to supply a bias current;
a superconducting loop in series with the input arm and including a constriction, wherein the constriction is switchable among:
a) a first superconducting state in which the bias current flows through the constriction; to
b) in response to absorption of a first photon, a resistive state, wherein the bias current is diverted to a remaining portion of the superconducting loop; and to
c) a second superconducting state, wherein the constriction returns to its superconducting form, wherein a portion of the bias current is retained in the superconducting loop as a loop current,
wherein the portion of the bias current is a measure of detection of the first photon, and wherein steps (a)-(c) are repeatable for each photon of a set of photons including the first photon sequentially impinging on the constriction, such that the loop current is a cumulative measure of detection of the set of photons;
a shunt electrically and thermally coupled to the superconducting loop to reduce the portion of the bias current that is retained at step (b); and
an output arm in series with the superconducting loop to receive the bias current or a remainder portion thereof.

16. The photodetector of claim 15, wherein the set of photons includes two photons or more.

17. The photodetector of claim 15, wherein the set of superconducting states includes up to twenty five superconducting states.

18. The photodetector of claim 15, wherein the output arm is isolated from the shunt.

19. The photodetector of claim 15, wherein a cross-sectional area of the constriction is at most 25% of a cross-sectional area of any other portion of the superconducting loop.

20. The photodetector of claim 15, wherein the superconducting loop includes a meandering nanowire, and wherein the nanowire includes the constriction.

* * * * *